United States Patent [19]

Blain

[11] Patent Number: 4,513,246
[45] Date of Patent: Apr. 23, 1985

[54] CLAMP-ON AMMETER

[76] Inventor: Aurele Blain, 23 Allanbrooke Dr., Islington, Ontario, Canada, M9A 3N7

[21] Appl. No.: 422,223

[22] Filed: Sep. 23, 1982

[30] Foreign Application Priority Data

Sep. 16, 1982 [CA] Canada .................................. 411606

[51] Int. Cl.$^3$ ............................................ G01R 19/00
[52] U.S. Cl. ................................ 324/127; 324/117 R; 324/129
[58] Field of Search ................... 324/117 R, 127, 129, 324/225, 253, 262; 336/176; 361/149, 267

[56] References Cited

U.S. PATENT DOCUMENTS

| 2,686,898 | 8/1954 | Schweitzer, Jr. | 324/127 |
| 2,901,705 | 8/1959 | Lamb | 324/156 |
| 2,927,270 | 3/1960 | Wilton | 324/73 |
| 3,213,365 | 10/1965 | Wilson | 324/115 |
| 3,213,366 | 10/1965 | Eadie, Jr. | 324/127 |
| 3,277,368 | 10/1966 | Schweitzer, Jr. | 324/127 |
| 3,419,791 | 12/1968 | Mishkovsky | 323/44 |
| 3,426,275 | 2/1969 | Schweitzer, Jr. | 324/127 |
| 3,465,250 | 9/1969 | Schilling | 324/127 |
| 3,475,682 | 10/1969 | Peek et al. | 324/127 |
| 3,482,163 | 12/1969 | Peek et al. | 324/117 R |
| 3,546,565 | 12/1970 | Downing, Jr. et al. | 323/6 |
| 3,649,912 | 3/1972 | Nakamura | 324/127 |
| 3,706,032 | 12/1972 | Vikstrom | 324/127 |
| 3,882,387 | 5/1975 | Vikstrom | 324/117 R |
| 4,005,380 | 1/1977 | Heilmann et al. | 324/127 |
| 4,059,798 | 11/1977 | Dierker et al. | 324/127 |

Primary Examiner—Michael J. Tokar
Assistant Examiner—Kevin D. O'Shea
Attorney, Agent, or Firm—Rogers, Bereskin & Parr

[57] ABSTRACT

A clamp-on ammeter for measuring current flows in a conductor is described. The ammeter is of a type comprising a magnetic core which can be located about a conductor and an indicator which responds to the magnetic flux consequently generated in the magnetic core to produce a signal indicative of the magnitude of the conductor current. Means are provided for restoring the magnetic core to a predetermined magnetic state for each measurement. The resetting means include a coil wound about the core and a coil energizing circuit which can be activated to produce in the core a residual magnetic flux substantially identical to that produced in the core when unmagnetized by a DC conductor current of predetermined magnitude, which represents the maximum value of any DC current which can be measured by the ammeter. The ammeter includes another coil and energizing circuitry which then produce in the core an offsetting magnetic flux equal in magnitude but opposite in direction to the residual magnetic flux, thereby eliminating any offset which would otherwise be generated by the indicator in response to the residual magnetic flux. To adapt the ammeter for AC measurements, another coil is wound on the core and is electrically shorted when the magnetic flux cutting the windings of the coil changes direction from that of the residual magnetic flux. The shorting of the coil tends to reduce the magnitude of the magnetic flux in the core to substantially zero. By employing an indicator responsive to a time average magnitude of the core magnetic flux a signal indicative of the magnitude of an alternating current carried by a conductor is produced.

8 Claims, 5 Drawing Figures

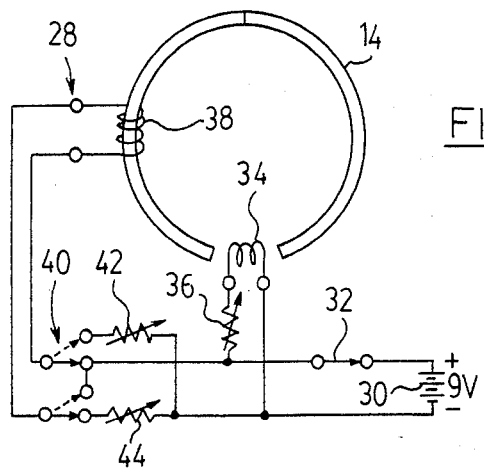
FIG. 2
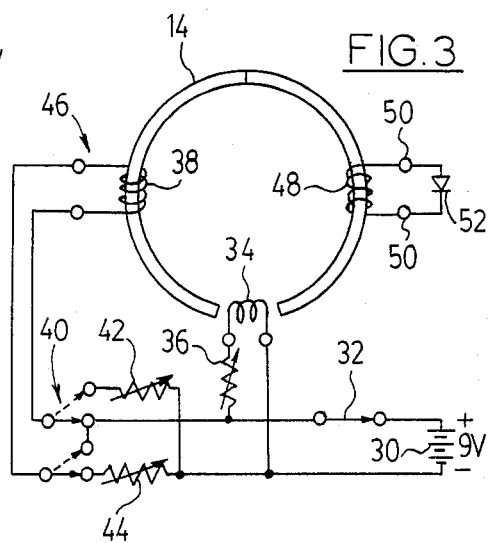
FIG. 3
FIG. 4
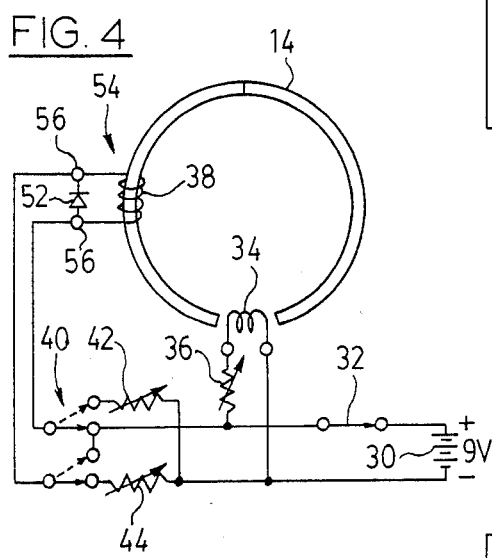
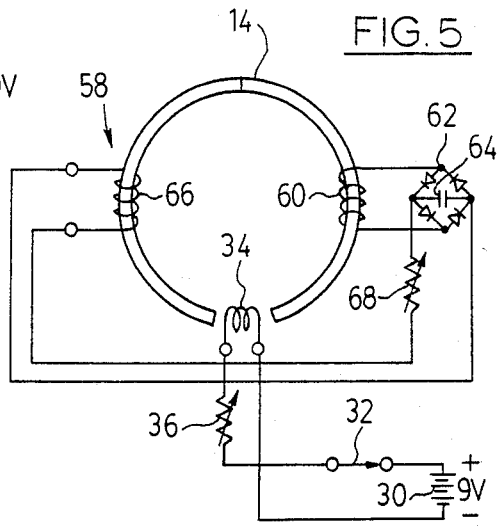
FIG. 5

CLAMP-ON AMMETER

FIELD OF THE INVENTION

The invention relates to clamp-on ammeters which can indicate the magnitude of a current flowing in a conductor by measurement of magnetic fields generated about the conductor.

BACKGROUND OF THE INVENTION

The invention relates to ammeters of the type employing a magnetic core that is hinged or otherwise mechanically adapted to be located around a current carrying conductor. The conductor current induces a magnetic flux in the core whose magnitude varies with that of the current. A flux sensing device such as a moving coil galvanometer respond to the magnitude of the magnetic flux to produce a signal indicative of the magnitude of the conductor current. Such ammeters are well known.

The measurement made by such an ammeter is significantly affected by the "magnetic history" of the core. Once a magnetizing force has been applied to the magnetic core of the ammeter, the magnetic characteristics of the core, namely, the residual magnetic flux and the relationship between core flux and magnetizing force, are changed. The residual magnetic flux tends to produce an offset in the signal when no external magnetizing force is applied to the core and produces an offset in the signal generated by the flux sensor. The resulting relationship between core magnetic flux and magnetizing force will affect the scaling of the signal generated by the flux sensor. Because both the residual magentic flux and relationship between core magnetic flux and magnetizing force will depend on previous current measurements and in particular on the most recent maximum flux of a particular polarity produced in the core, consistent measurements cannot be taken with such an ammeter.

The effect of the magnetic history of the core of a clamp-on ammeter on the accuracy of measurements is recognized in U.S. Pat. No. 4,059,798 which issued to Diercker et al on Nov. 22, 1977. In the Diercker patent it was proposed that a coil be wound about the magnetic core and periodically energized with a damped oscillatory current wave form to restore the magnetic core to a substantially unmagnetized state.

An alternative approach was taken in U.S. Pat. No. 3,706,032 which issued on Dec. 12, 1972 to Vikstrom. In the Vikstrom patent it was proposed that the magnetic core of a DC clamp-on ammeter be made restorable to a predetermined magnetic condition by winding a resetting coil about the core and providing means for energizing the resetting coil to generate a predetermined magnetic field in the core to produce a residual flux that ensures operation substantially along the outermost hysteresis loop of the core. This would ensure that core magnetic flux would vary in a reproducible manner with the magnetizing force generated by a conductor current. It was proposed that the magnetic core be made momentarily separable to vary the reluctance of the core in a predetermined fashion. A sensor responsive to any resulting change in core flux could then produce a signal indicative of conductor current. Because the net change in core flux is to be measured, the residual flux in the magnetic core would tend not to affect measurements. However, since mechanical means are required to change the reluctance of the magnetic core, it may be expected that the accuracy of measurements will vary with wear or aging of the mechanical separating means.

BRIEF SUMMARY OF THE INVENTION

The invention provides an ammeter with a magnetic core that is locatable around a conductor. Means are provided for inducing a magnetic flux in the core that produces a residual magnetic flux substantially identical to that produced in the core when unmagnetized by a conductor current of a predetermined value. The reset means can thus be activated to restore the magnetic core to a predetermined state with a predetermined residual magnetic flux and a predetermined relationship between magnetizing force and core magnetic flux. Means are provided for generating an offsetting magnetic flux which is substantially identical in magnitude but opposite in direction to the predetermined residual magnetic flux. Means are provided for indicating the magnitude of the magnetic flux in the core and consequently the magnitude of the current flowing in a conductor about which the magnetic core has been located. The ammeter as described is suited to measuring DC currents in a conductor which have a value less than the predetermined value mentioned above.

According to the invention, the described ammeter can be adapted for measurement of AC conductor currents of magnitude less than the predetermined magnitude. A flux nulling coil is electromagnetically coupled to the core so that the core magnetic flux cuts the windings of the coil. Shunt means responsive to the direction of the magnetic flux in the core are provided to substantially short-circuit the windings of the coil whereby a back magnetomotive force is generated in the core tending to reduce the magnitude of the core magnetic flux substantially to zero. With the indicator means adapted to produce a signal indicative of the time average magnitude of the core magnetic flux, a signal indicative of the magnitude of an AC conductor current is generated.

BRIEF DESCRIPTION OF THE DRAWINGS

The invention will be better understood with reference to drawings in which:

FIG. 2 is a diagramatic representation of an electromagnetic assembly adapted for measurement of direct currents;

FIG. 3 is a diagramatic representation of the electromagnetic assembly of FIG. 2 adapted for measurement of both alternating and direct current;

FIG. 4 is a diagramatic representation of an alternative embodiment of the electromagnetic assembly of FIG. 3; and, FIG. 5 is a diagramatic representation of an electromagnetic assembly adapted for measurement of alternating currents.

DESCRIPTION OF PREFERRED EMBODIMENTS

Figure 1:
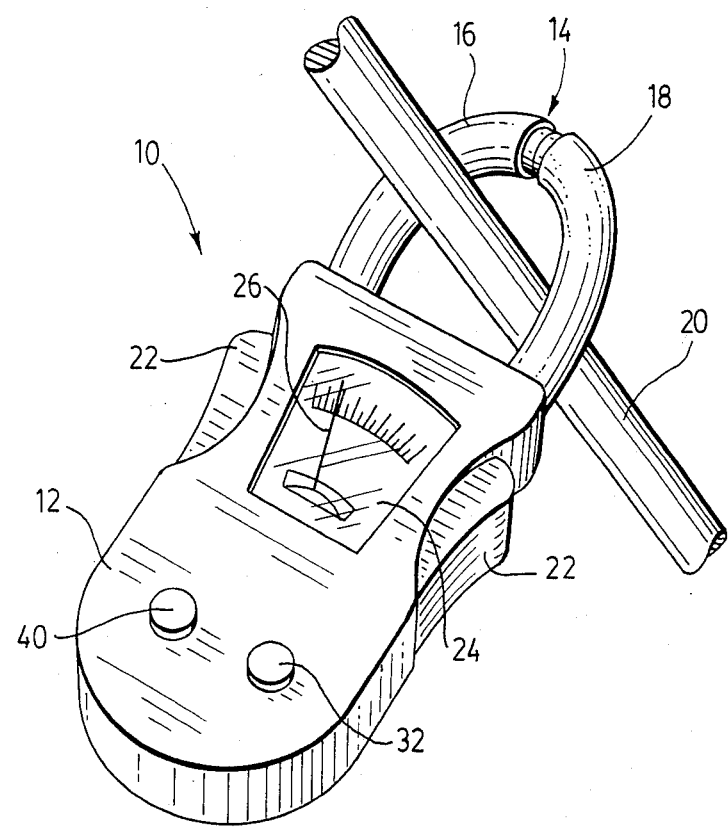
FIG. 1 is a perspective view of an ammeter embodying the invention.

Reference is made to FIG. 1 which illustrates an ammeter 10 including a housing 12 which can contain any one of the electromagnetic assemblies illustrated in FIGS. 2-5. The ammeter 10 is of the clamp-on variety and has a magnetic core 14 which is constructed in two separable core members 16, 18. The core members 16, 18 are mounted in a conventional manner to housing 12 which permits the core members 16, 18 to be separated for location about a conductor when a pair of arms 22, are squeezed. Current carried by the conductor induces a magnetic flux in the core 14 which flux varies in magnitude with the conductor current. The ammeter 10 includes a scaled member 24 and a co-operating pointer 26 which register the magnitude of the conductor current.

FIG. 2 diagramatically illustrates an electromagnetic assembly 28 contained in the housing 12 and electromagnetically coupled to the core 14 for measurement of direct current in the conductor. The assembly 28 is powered by a 9 volt battery 30 and is activated with an on-off switch 32.

Magnetic flux in the core 14 is sensed by a conventional moving coil 34 which is mounted in a gap in the core 14. The battery 30 produces a current flow in the coil 34 which in turn produces a magnetic field that interacts with the magnetic flux in the core 14. This interaction of magnetic fields causes the coil 34 to rotate to a degree determined by the magnitude of the core flux. The pointer 26 is fixed to the moving coil 34 and consequently indicates the magnitude of the core flux against the scaled member 24. The extent to which the pointer 26 deflects with a core flux of given magnitude can be varied by adjusting a variable resistor 36 which determines the magnitude of the current flowing in the moving coil 34.

A flux inducing coil 38 is wound around a portion of the magnetic core 14. The coil 38 is coupled by a double-pole, double-throw switch 40 to the battery 30. The switch 40 is biased normally to be oriented in the state illustrated in solid lines in FIG. 2, but can be momentarily activated to orient in the state illustrated in stippled outline in FIG. 2. The coil 38 can consequently be energized in two different modes.

In the first mode, which is of a momentary nature, the coil 38 serves to restore a predetermined residual magnetic flux in the core 14. In this mode the coil 38 receives a current pulse whose magnitude can be adjusted with a variable resistor 42. The coil 38 consequently produces a magnetic flux in the core 14 that corresponds to the flux which would be produced by a direct current of the maximum value to be measured by the ammeter 10. The core 14 is consequently set to a predetermined magnetic state with a predictable magnetic flux and also a predictable relationship between magnetizing force and core flux. It will be appreciated that the appropriate magnitude and setting for the resistor 42 will depend largely on the characteristics of the core 14 and flux inducing coil 38. Adjustment of the resistor 42 is effected by noting the deflection of the pointer 26 in response to a DC conductor current of a maximum value to be measured or by allowing for full scale deflection of the pointer 26 if appropriate. It will also be appreciated that the duration of the pulse supplied to the coil 38 in the first mode need only be sufficient to permit the magnitude of the core flux to rise to the required value and that this will normally be a fraction of a second.

In the second mode the coil 38 is energized to produce in the core 14 an offsetting magnetic flux whose direction in the core 14 is opposite to that of the residual flux. In this mode the coil 38 receives a continuous current from the battery 30. The magnitude of the current and consequently the offsetting flux can be varied by adjusting a variable resistor 44. The current is adjusted until the offsetting flux substantially balances the residual magnetic flux in which case the pointer 26 will indicate that there is no magnetic flux in the core. The scaled member 24 may now be calibrated by measurement of a series of direct currents of predetermined magnitude varying between zero and the maximum value to be measured by the ammeter 10. To thereafter ensure the accuracy of any current measurement, the switch 40 may be momentarily activated to restore the magnetic characteristics of the core 14 to those present at the time of calibration.

The assembly 28 is adapted for measurement of direct currents of a given polarity. This polarity is such as to induce a magnetic flux in the core 14 in the direction indicated in FIG. 2 by an arrow on the symbolic representation of the core 14. If the ammeter 10 is clamped about a current carrying conductor in an inappropriate orientation the pointer 26 will tend to indicate a negative current flow. In such circumstances the magnetic characteristics of the core 14 must be reset by activating the switch 40 prior to reversing the orientation of the magnetic core 14 about the current carrying conductor.

FIG. 3 illustrates an alternative embodiment 46 of an electromagnetic assembly which is substantially the electromagnetic assembly 28 adapted for measurement of both alternating and direct currents. Like reference numerals have been used to indicate like components whose operation will be apparent from the description above.

When the magnetic core 14 is located around a conductor carrying an alternating current, the core flux changes polarity at a frequency corresponding to that of the conductor current. This changing flux polarity tends to alter the magnetic characteristics of the core, namely, the core hysteresis curve that determines the relationship between core flux and magnetizing force. The electromagnetic assembly 46 is consequently provided with a flux nulling coil which is wound about a portion of the core 14 and which has terminals 50 that are shunted by a diode 52 (parallel connected to the coil 48). With the flux nulling coil 48 wound about the core 14 as indicated, core flux in the direction of the arrow indicated in FIG. 3 on the core 14 will induce a voltage drop across the coil 48 that tends to reverse bias the diode 52 so that substantially no current flows in the coil 48. In such circumstances the magnetic flux of the core 14 is substantially uneffected. When the flux changes polarity, the diode 52 becomes forward biased and tends to substantially short-circuit the terminals 50 thereby permitting a relatively large current flow in the coil 48. This current flow produces an opposing flux in the core 14 which substantially reduces the core flux to a zero level. To ensure that no substantial reverse flux is experienced by the core 14, the diode 52 is preferably a germania-type device with a very low forward turn-on voltage or any other diode device with similar characteristics. It will be appreciated that an electronic switching circuit better adapted to short the coil terminals 50 as the voltage drop across the coil terminals approaches zero from a particular polarity and avoiding the offset effectively created by the diode turn-on voltage can be substituted for the diode 52.

For proper measurement of AC conductor currents the electromagnetic assembly 46 requires a flux sensor responsive to the average level of the core flux. The moving coil 34 is damped sufficiently to respond essentially to the average flux level. It will be appreciated that the moving coil 34 can be replaced in such circumstances by any device capable of producing a signal indicative of the average magnitude of the core flux.

FIG. 4 illustrates an electromagnetic assembly 54 which is essentially an alternative embodiment of the assembly 48. Like components have consequently been labelled with like reference numerals and function as described above. In the assembly 54 the flux inducing coil 38 serves not only as means for inducing fluxes in the core 14 when coupled to the battery 30 but also performs the function provided by the flux nulling coil 48 of the assembly 46. The diode 52 is now connected in parallel with the flux inducing coil 38 to short the terminals 56 of the coil 38 when core flux changes direction from that indicated by the arrow on the core 14. Thus when an AC conductor current is being measured the core 14 effectively responds only to half cycles of a particular polarity of the conductor current.

FIG. 5 illustrates an electromagnetic assembly 58 adapted for measurement of alternating current flows in a conductor. Components common to the assemblies of FIGS. 2 and 5 have been labelled with like reference numerals and function in a similar manner. The assembly 58 includes a flux detecting coil 60 which is wound on a portion of the core 14. The magnetic flux induced in the core 14 by an alternating conductor current produces a corresponding alternating voltage across the flux detecting coil 60 which alternating voltage is rectified and smoothed by a diode bridge and capacitor 64. The rectified voltage is applied to a flux inducing coil 66 wound on another portion of the core 14. This induces a relatively constant magnetic flux in the core 14 whose magnitude can be varied by adjusting a variable resistor 68. It will be appreciated that the magnitude of the constant flux will be proportional to that of the alternating conductor current.

The moving coil 34 is once again used to sense the core flux. The moving coil 34 is sufficiently damped that it does not respond to the magnetic flux induced in the core 14 by the alternating conductor current; however, the coil 34 rotates in response to the constant magnetic flux induced in the core 14 by the flux inducing coil 66. The resultant rotation of the moving coil 34 and consequently the pointer 36 against the scale member 24 results in a signal indicative of the magnitude of the alternating connector current.

It will be appreciated that particular embodiments of the invention have been illustrated and that modifications may be made therein without departing from the spirit of the invention or the scope of the appended claims.

I claim:

1. A device for measuring a current of magnitude less than a predetermined maximum value, flowing in a conductor comprising:
   a magnetic core locatable around the conductor;
   residual flux reset means which can be momentarily activated to induce in the core a magnetic flux that produces in the magnetic core a residual magnetic flux substantially identical to the residual magnetism which is produced in the core when unmagnetized by a direct current of the predetermined maximum value flowing in a conductor around which the core is located;
   offset flux generating means for inducing in the magnetic core an offsetting magnetic flux of substantially identical magnitude but of opposite direction to the residual magnetic flux;
   indicator means for indicating the magnitude of the magnetic flux in the magnetic core;
   whereby, with the residual flux resetting means momentarily activated to produce the residual magnetic flux in the magnetic core and with the magnetic core then located around the conductor, the indicator means respond to the magnetic flux induced in the core by current in the conductor and the signal generated by the indicator means is indicative of the magnitude of any DC current flowing in the conductor of magnitude less than the predetermined maximum value.

2. A device as claimed in claim 1 comprising a flux inducing coil located about a portion of the core and energizeable to induce a magnetic flux in the magnetic core.

3. A device as claimed in claim 2 in which the residual flux reset means comprise means for producing in the flux inducing coil a current pulse that produces the residual magnetic flux in the core.

4. A device as claimed in claim 3 in which the offset flux generating means comprise means for energizing the flux inducing coil to induce the offsetting magnetic flux in the magnetic core.

5. A device as claimed in claim 1 adapted for measurement of AC currents in a conductor comprising:
   a flux nulling coil located around a portion of the core whereby the magnetic flux in the magnetic core cuts the windings of the core, the flux nulling having a pair of terminals; and,
   shunt means for substantially short-circuiting the terminals of the flux nulling coil during intervals when the magnetic flux in the magnetic core changes direction from that of the residual magnetic flux whereby the flux nulling coil induces in the core a back magnetomotive force which reduces the magnitude of the magnetic flux in the magnetic core substantially to zero during the intervals;
   and wherein the indicator means produces a signal indicative of the average magnitude of the magnetic flux in the magnetic core.

6. A device as claimed in claim 5 in which the shunt means comprise a diode connected in parallel to the flux nulling coil.

7. A device for measuring AC currents in a conductor comprising:
   a magnetic core locatable around the conductor;
   indicator means responsive to the magnetic flux in the core for producing a signal indicative of the average magnitude of the magnetic flux in the core;
   a flux nulling coil located around a portion of the magnetic core whereby the magnetic flux in the core cuts the windings of the flux nulling coil, the flux nulling coil having a pair of terminals;
   shunt means for substantially short-circuiting the terminals of the flux nulling coil during intervals when the magnetic flux in the core changes direction within the core from a predetermined direction whereby the flux nulling coil induces in the magnetic core a back magnetomotive force which reduces the magnitude of the magnetic flux in the core substantially to zero;
   whereby, when the core is located about the conductor the signal generated by the indicator means is indicative of the magnitude of the AC current in the conductor.

8. A device as claimed in claim 7 in which the shunt means comprises a diode connected in parallel with the flux nulling coil.

* * * * *